US010788180B2

(12) United States Patent
Tang

(10) Patent No.: US 10,788,180 B2
(45) Date of Patent: Sep. 29, 2020

(54) LIGHT RAY CONCENTRATOR

(71) Applicant: Paul E. Tang, Hillsboro, OR (US)

(72) Inventor: Paul E. Tang, Hillsboro, OR (US)

(73) Assignee: Paul E. Tang, Hillsboro, OR (US)

(*) Notice: Subject to any disclaimer, the term of this patent is extended or adjusted under 35 U.S.C. 154(b) by 79 days.

(21) Appl. No.: 15/623,358

(22) Filed: Jun. 14, 2017

(65) Prior Publication Data

US 2017/0356610 A1    Dec. 14, 2017

Related U.S. Application Data

(60) Provisional application No. 62/350,092, filed on Jun. 14, 2016.

(51) Int. Cl.
*F21S 11/00* (2006.01)
*F21V 8/00* (2006.01)
(Continued)

(52) U.S. Cl.
CPC ............ *F21S 11/007* (2013.01); *F24S 23/31* (2018.05); *G02B 19/0028* (2013.01);
(Continued)

(58) Field of Classification Search
CPC ........ F21S 11/00; F21S 11/002; F21S 11/007; G02B 6/0001; G02B 6/0005;
(Continued)

(56) References Cited

U.S. PATENT DOCUMENTS 4,297,000 A    10/1981  Fries
5,404,869 A     4/1995  Parkyn, Jr. et al.
(Continued)

FOREIGN PATENT DOCUMENTS

CN    101220997 A     7/2008
CN    203365792 U    12/2013
WO    2015119071 A1   8/2015

OTHER PUBLICATIONS

U.S. Receiving Office, International Search Report for PCT/US2017/37571 dated Sep. 11, 2017.
(Continued)

*Primary Examiner* — Bumsuk Won
*Assistant Examiner* — Ephrem Z Mebrahtu
(74) *Attorney, Agent, or Firm* — Kolisch Hartwell, P.C.

(57) ABSTRACT

An optical device and systems using an optical device are provided, where the optical device may be configured for collimating incoming light rays. The optical device may include a host medium substantially comprised of a transparent material and an array of substantially transparent structures embedded within the host medium. The structures of the array each include a convex side presented to the incoming light rays and a concave side that passes light rays through toward the output face of the host medium, collimating the rays. Multiple stages of arrays may be provided in the optical device, typically with lengthening aspect ratios and increasing indexes of refraction in a direction from the input face toward the output face. The systems may use the optical device for using an exterior light to illuminate an interior space in a building or to generate power.

20 Claims, 13 Drawing Sheets

(51) Int. Cl.
*H01L 31/054* (2014.01)
*G02B 19/00* (2006.01)
*G02B 27/30* (2006.01)
*F24S 23/30* (2018.01)
*G02B 3/08* (2006.01)
*G02B 5/20* (2006.01)

(52) U.S. Cl.
CPC ...... *G02B 19/0038* (2013.01); *H01L 31/0543* (2014.12); *F21S 11/002* (2013.01); *F24S 23/30* (2018.05); *Y02B 10/10* (2013.01); *Y02E 10/52* (2013.01)

(58) Field of Classification Search
CPC .............. G02B 6/0008; G02B 19/0028; G02B 19/0038; F24S 23/12; F24S 23/30; F24S 23/31; H01L 31/054; H01L 31/0543; Y02E 10/52; Y02B 10/10; Y02B 10/20
See application file for complete search history.

(56) References Cited

U.S. PATENT DOCUMENTS

| | | | |
|---|---|---|---|
| 5,581,447 A * | 12/1996 | Raasakka | F21S 11/00 362/557 |
| 6,620,995 B2 | 9/2003 | Vasylyev et al. | |
| 6,639,733 B2 | 10/2003 | Minano et al. | |
| 6,646,807 B2 | 11/2003 | Yoshikawa et al. | |
| 7,428,367 B2 | 9/2008 | Lubart et al. | |
| 8,184,372 B1 * | 5/2012 | Gu | G02B 3/08 359/597 |
| 8,393,777 B2 | 3/2013 | Minano et al. | |
| 8,993,871 B2 | 3/2015 | Nishiwaki | |
| 9,244,212 B2 | 1/2016 | Holman et al. | |
| 2004/0094696 A1* | 5/2004 | Ramirez-Iniguez | G02B 5/288 250/216 |
| 2006/0245060 A1* | 11/2006 | Goto | G02B 5/003 359/613 |
| 2007/0002452 A1 | 1/2007 | Munro | |
| 2011/0067687 A1* | 3/2011 | Raymond | F21S 11/00 126/600 |
| 2011/0141765 A1 | 6/2011 | Chang et al. | |
| 2011/0186106 A1 | 8/2011 | Parker et al. | |
| 2014/0119033 A1* | 5/2014 | Vasylyev | G02B 6/001 362/327 |
| 2014/0209581 A1* | 7/2014 | Pawlowski | B23K 26/03 219/121.69 |
| 2014/0240839 A1 | 8/2014 | Yang et al. | |
| 2014/0345689 A1* | 11/2014 | Ramirez-Iniguez | H01L 31/02325 136/259 |
| 2017/0016679 A1 | 1/2017 | Barwig et al. | |
| 2017/0115473 A1* | 4/2017 | Kozodoy | F21S 11/002 |

OTHER PUBLICATIONS

U.S. Receiving Office, Written Opinion for PCT/US2017/37571 dated Sep. 11, 2017.
PCT, International Bureau of WIPO, International Preliminary Report on Patentability for PCT/US2017/37571 dated Dec. 18, 2018, 6 pages.
Canadian Intellectual Property Office, Examiner's Search Report for Canadian Patent Application No. 3027431, dated Nov. 21, 2019, 6 pages.
European Patent Office, Extended European Search Report for European Patent Application No. 17814054.7, dated Jan. 9, 2020, 9 pages.
National Intellectual Property Administration, P.R. China, First Office Action in Chinese Patent Application No. 201780049642.2, dated Jan. 14, 2020, 21 pages.

* cited by examiner

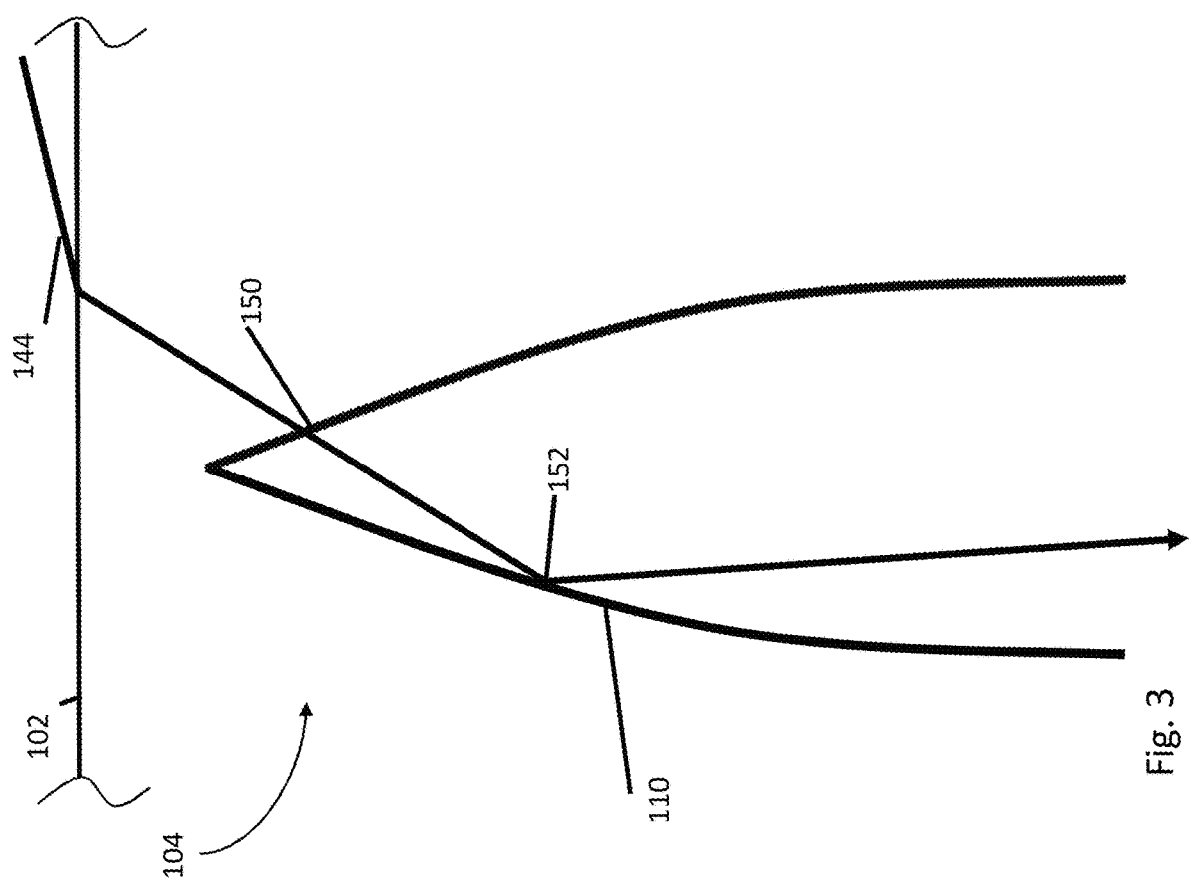

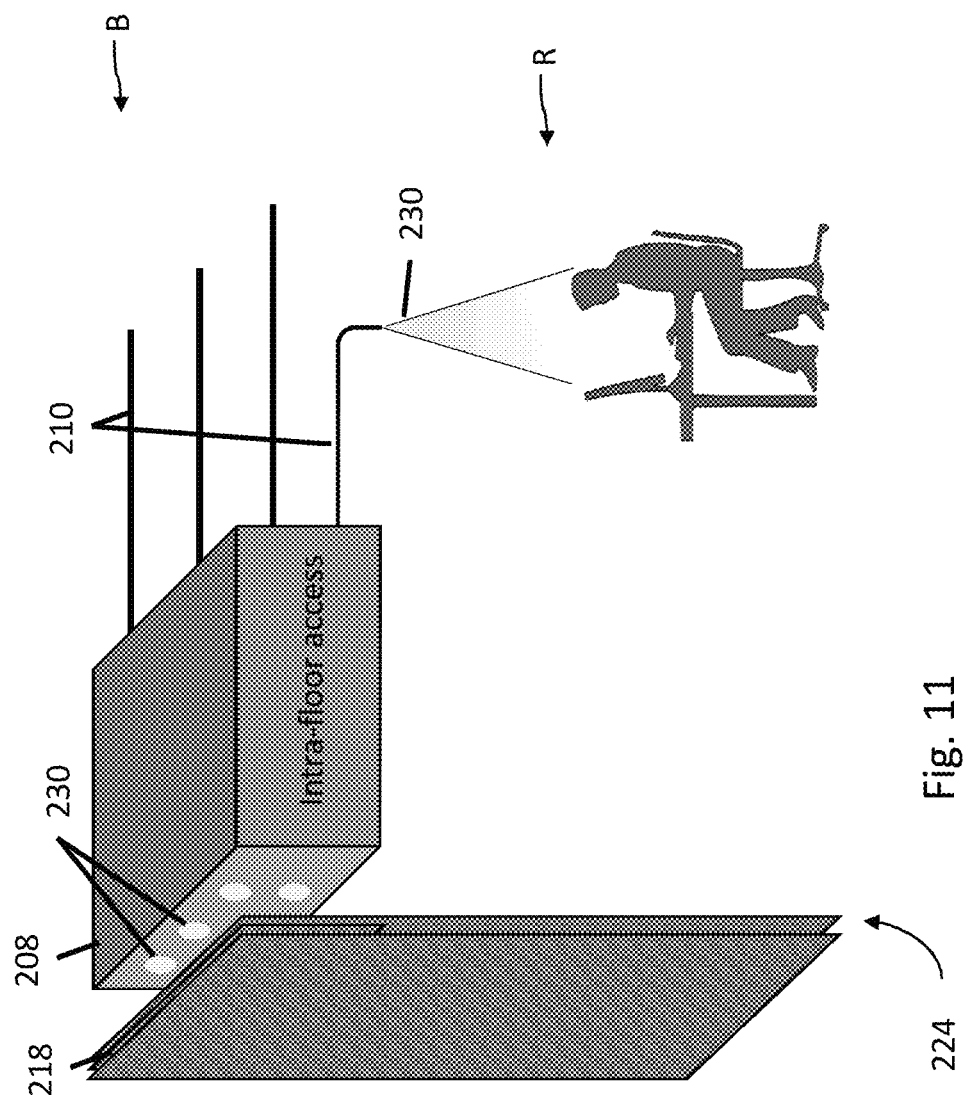

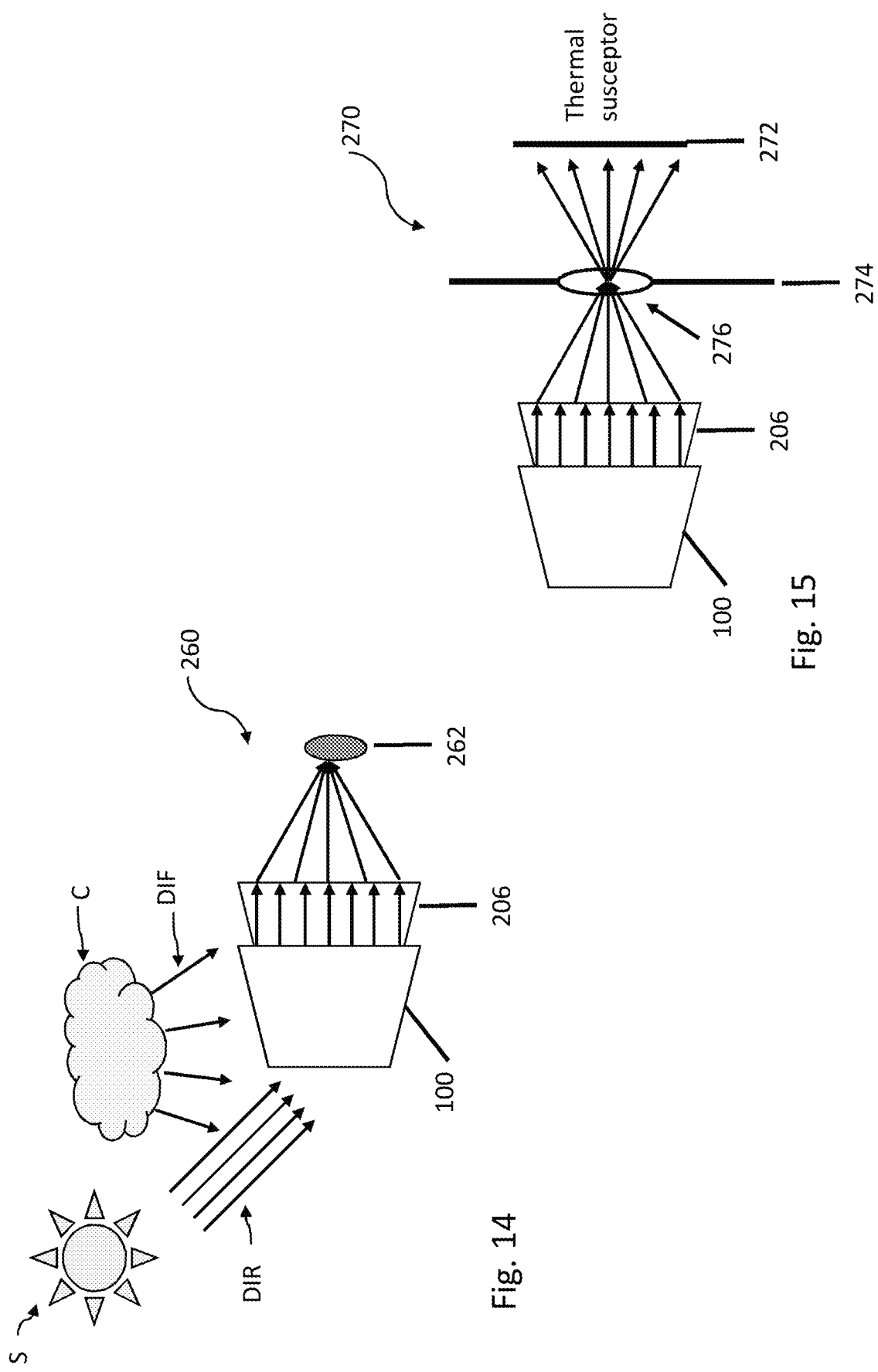

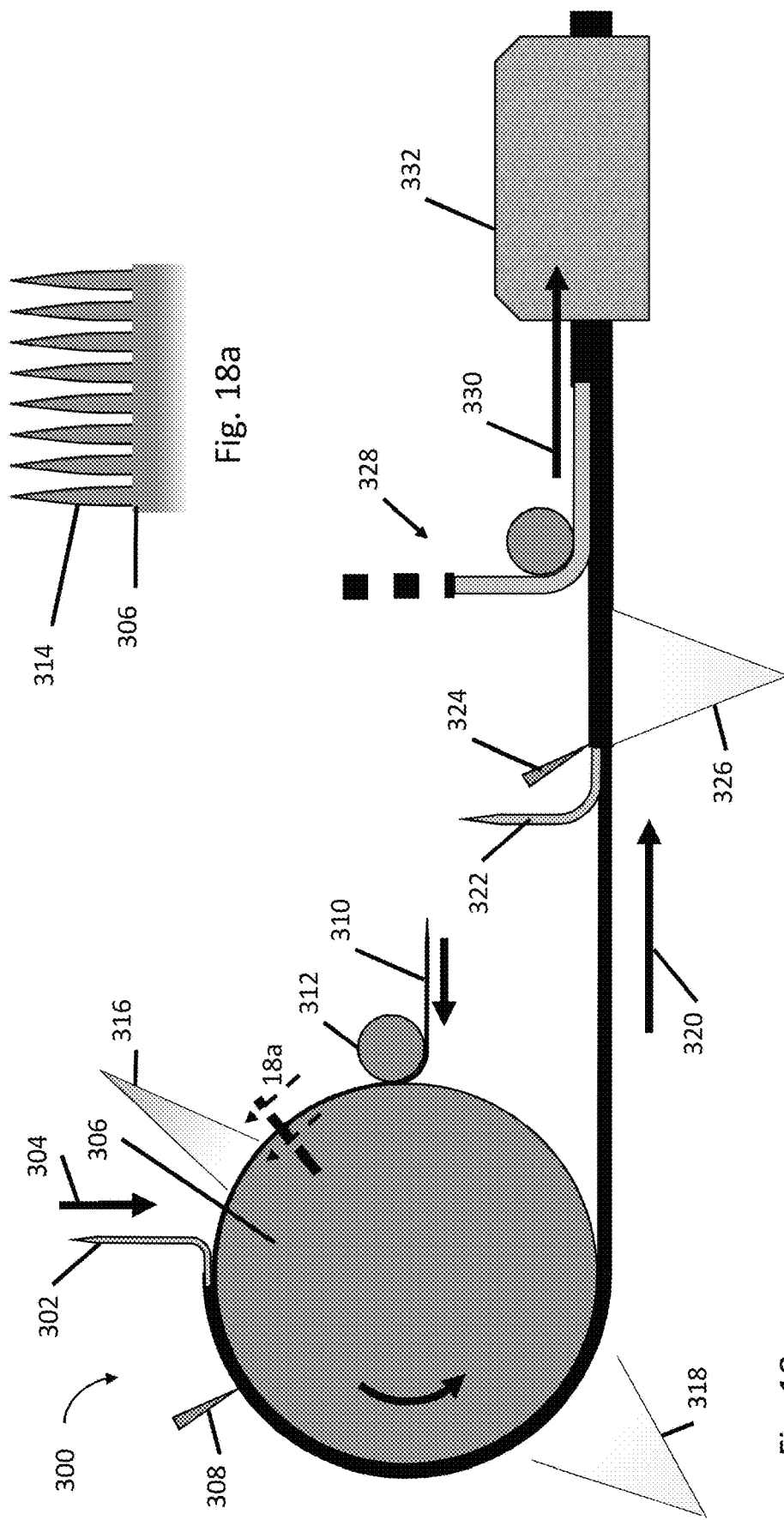

LIGHT RAY CONCENTRATOR

FIELD OF THE DISCLOSURE

The field of the present disclosure includes transmissive optical devices for concentrating light by reducing the angle of light rays arriving at a wide range of incident angles to be output at a narrower range of incident angles. The field also includes optical devices with thin film elements embedded within a transparent material.

BACKGROUND AND SUMMARY OF THE DISCLOSURE

Optical devices have been proposed for collimating light that is coming from a known and well-oriented light source. The optical devices have not been designed or optimized for incoming light rays of diffused light or light coming from an unknown direction.

The present disclosure is directed to optical devices for collimating and concentrating light rays arriving from diffuse and/or unknown directions. The devices of the present disclosure are optimized for receiving light rays at a wide range of input angles and reducing the range of angles of the light rays as they pass through the devices.

The present disclosure provides various systems, apparatus, and methods of use thereof. In some examples, an optical device may include an input face, a host medium, and an output face. The host medium may be formed of a substantially transparent medium, such as glass or plastic, with a refractive index determined by the application of the device. For a typical application of reducing the range of incident angles of diffuse sunlight, a typical index of refraction for the host medium is about 1.6.

As a further example, an array of substantially transparent thin film sheet structures may be embedded within the host medium. Typically, the structures are periodically arrayed within the host medium, defining a plane that is parallel to the input face of the optical device. The structures may be formed of a material with a lower index of refraction than that of the host medium, for example, with the index of refraction of the host medium about 1.6, a typical index of refraction for the structures is about 1.4.

As further examples, the optical device may include two or more stages of arrays of structures within the host medium, such as three stages. Typically, the structures are substantially identical within each array, while varying in aspect ratios from one array to the next. The gaps between the structures in each array may be the same from each array to the next and the structures may have substantially the same width in each array, allowing for structures in each array to be aligned with structures in the other array(s). In some examples, the structures have a positive curvature, the degree of which may be selected for a particular application for the optical device.

As another example, the structures in each stage of the arrays may have a higher aspect ratio than the structures of the preceding stage and the index of refraction (IOR) of the structures may be less than that of the host medium 104. Typically, in an optical device with a first stage with $IOR_{structure}$ of 1.4 and $IOR_{host}$ of 1.6, the subsequent stages have higher IORs, with the last stage being at or close to 1.6. In some examples, for a given highest expected incoming rays, the index of refraction of the embedded structures (IORs) relative to the $IOR_{host}$ may be chosen just low enough to capture such rays.

As a further example, the minimum thickness of each embedded structure is greater than about 2 wavelengths of the expected waves. In an application for sunlight, the minimum thickness may be about 1 μm and the optical device may be provided with more than 5 stages. For example, a device may be provided with successive stages of 10 um, 20 um, 50 um, 100 um, 200 um, 500 um in a device with total thickness of about 880 um.

An example of lighting systems that include the optical device of the present disclosure include those for use in architectural and power generation applications. An example of an architectural application is a system for a building with the optical device installed externally and coupled to fiber optic cables for delivery of exterior light into the building for indoor illumination. This system's use of fiber optic cables provides for more compact, efficient, and flexible transmission of light to the building's interior as compared to reflective tubes. This system's use of a passive light-reception device, i.e., the optical device, is lower profile and less expensive, both in initial cost and maintenance, but comparable in performance, as compared to systems that using an external tracking mechanism.

Another example of an architectural application is a system for installation on or within the windows of a building for consistent illumination from sunlight of a fixed location within the building. An example in power generation applications is incorporation of the optical device to collimate light in a system for focussing and/or redirection to photovoltaic cells or thermal susceptors.

A normal glass window allows light to pass through at the original angles of the exterior light. This is variable throughout the day and through seasonal changes. Within the building, the reach of the light through a normal glass window scales roughly 1:1 with the height of window. A window with a daylighting film provides for light projecting through with a specular reflection toward the ceiling. This is dependent on the original light direction and may require a diffuser to minimize this dependence and glare. The reach of the light through the daylighting film scales roughly 4:1 with the height of film application. A collimating sheet in accordance with the present disclosure provides for light to be collimated toward a preset direction and the angle is not variable throughout the day and throughout seasonal changes. The reach of direct light scales more than 20:1 with height of the collimating sheet application.

Features, functions, and advantages may be achieved independently in various examples of the present disclosure, or may be combined in yet other examples, further details of which can be seen with reference to the following description and drawings.

BRIEF DESCRIPTION OF THE DRAWINGS

FIG. 3 is a closeup side view of one of the elements in the first stage of the device of FIGS. 1 and 2.

FIG. 11 is a pictorial view of a window and optical device assembly with a fiber optic coupling for illuminating a room inside a building using exterior light.

FIG. 14 is a schematic diagram of a system for power generation with the optical device and a photovoltaic cell.

FIG. 15 is a schematic diagram of a system for power generation with the optical device and a thermal susceptor.

FIG. 18 is a schematic view of a manufacturing system for the optical devices of the present disclosure.

FIG. 18a is a cross-sectional view taken at arrows 18a in FIG. 18 of the surface of a drum for forming the elements of the optical device.

DETAILED DESCRIPTION OF THE DISCLOSURE

Various examples of an optical device are described below and illustrated in the associated drawings. Unless otherwise specified, the optical device and/or its various components may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other optical devices. The following description of various examples is merely exemplary in nature and is in no way intended to limit the disclosure, its application, or uses. Additionally, the advantages provided by the examples, as described below, are illustrative in nature and not all examples provide the same advantages or the same degree of advantages.

Figure 1:
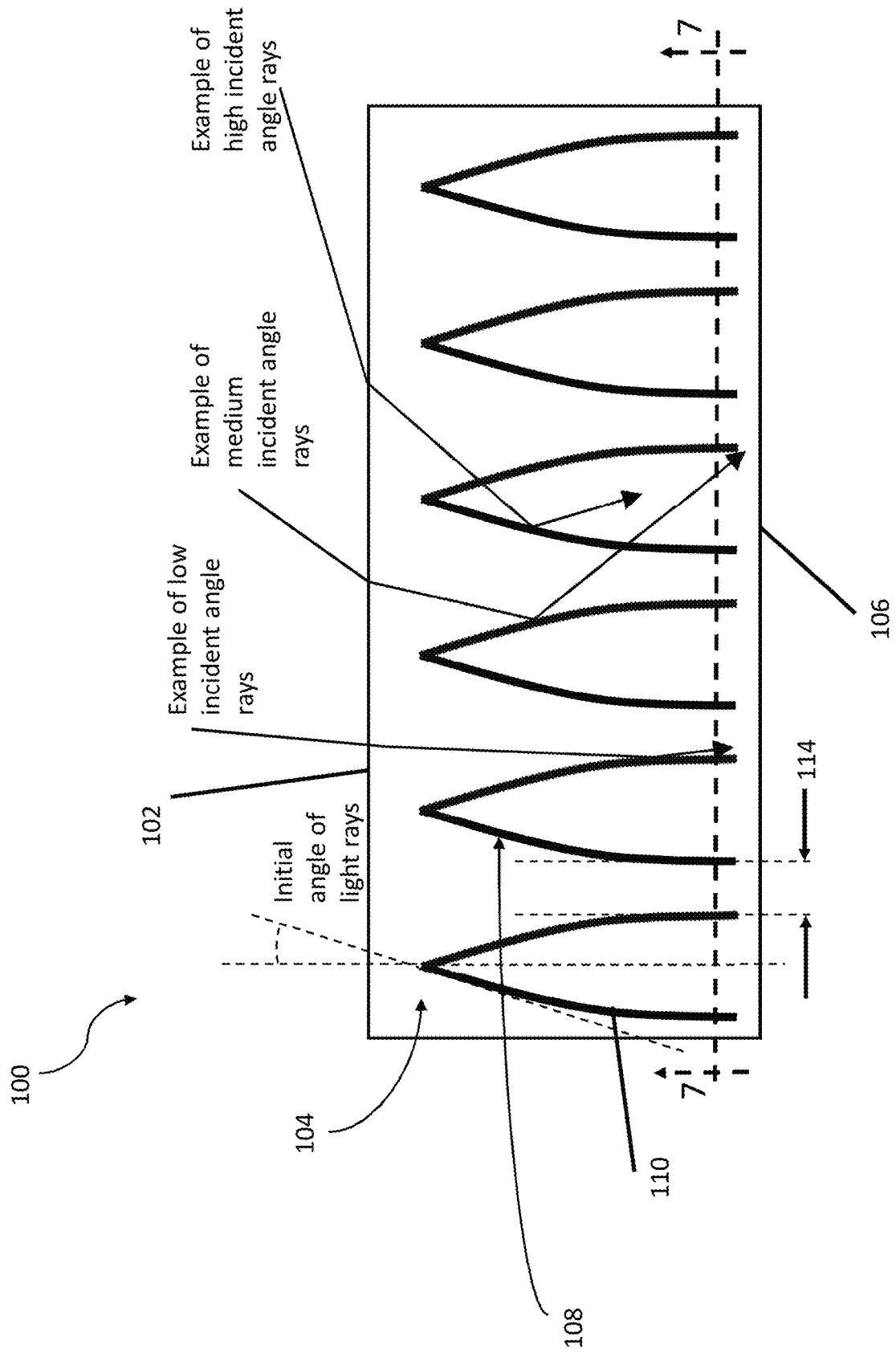
FIG. 1 is a side cross-sectional view of an optical device in accordance with aspects of the present disclosure, showing a single array of elements or structures in a host medium.

As shown in FIG. 1, an optical device 100 in accordance with one or more embodiments of the present disclosure may include an input face 102, a host medium 104, preferably formed of a substantially transparent medium, and an output face 106.

Light rays, as shown in FIG. 1, may arrive at input face 102 from any direction and pass through device 100. Light rays arrive at low, medium, and high incident angles compared to normal to input face 102.

Host medium 104 may be formed of a suitable material, such as glass or plastic, with a refractive index optimized for the particular composition, arrangement, and application of the device. Light rays arriving at input face 102 are initially refracted by the host medium, as shown in FIG. 1. A typical index of refraction for host medium 104 is about 1.6.

An array 108 of elements or structures 110 may be provided within host medium 104. For example, structures 110 may be identical, substantially transparent thin film sheets embedded within host medium 104. Typically, array 108 is parallel to input face 102 of the optical device and structures 110 are periodically arrayed within the host medium with a periodic gap 114 defined between each structure. Preferably, the material of the structures 110 has a lower index of refraction than that of the host medium. For example, with the index of refraction of the host medium about 1.6, a typical index of refraction for the structures 110 is about 1.4. The particular values and ratios for the indices of refraction may be determined as best suited for a particular application of the optical device.

Figure 2:
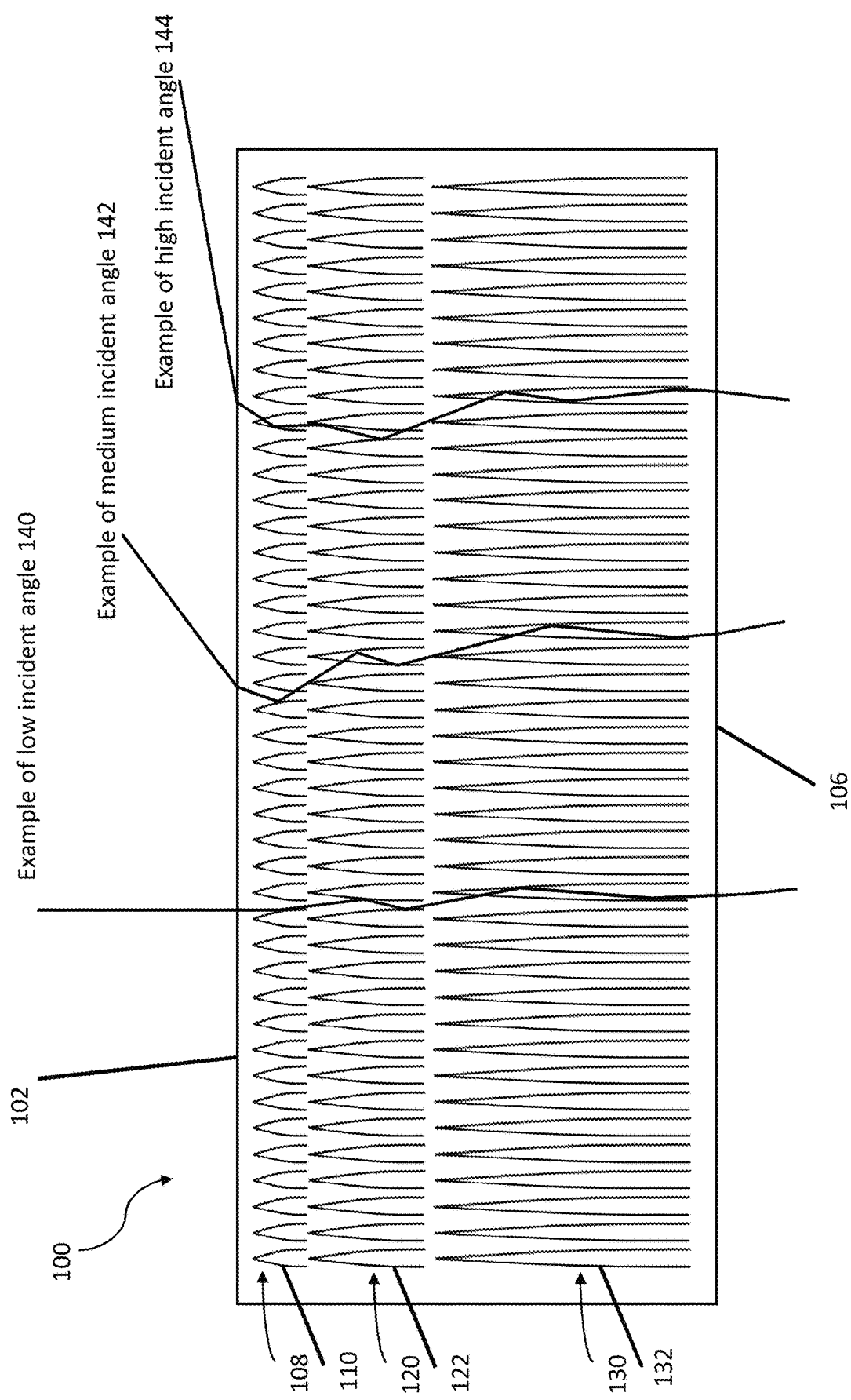
FIG. 2 is a side cross-sectional view of an optical device in accordance with aspects of the present disclosure, showing three stages of element arrays.

As shown in FIG. 2, optical device 100 may include multiple stages of arrays of structures within the host medium in a number optimized for the particular application of the device. E.g., three stages 108, 120, 130 of structures 110, 122, 132, respectively, may each be embedded within host medium 104 between input face 102 and output face 106 for light rays to pass through. The number of stages is not limited and may be selected as best suited for a particular application of an embodiment of the present disclosure.

FIG. 2 also illustrates a preferred embodiment for the structures 110, 122, and 132 in that within each array 108, 120, and 132, the structures are substantially identical. Between the arrays, however, the structures are preferably provided with aspect ratios that increase from one array to the next when proceeding from the input face toward the output face. For example, structures 122 in second stage 120 may have, as shown in FIG. 2, a greater length in a direction perpendicular to input face 102 and output face 106 as compared to the length of the structures 110 in first stage 108. Structures 122 typically have substantially the same width as structures 110, resulting in a greater aspect ratio of length over width in second stage 120 as compared to first stage 108. Similarly, as shown in FIG. 2, structures 132 in third stage 130 may have a greater aspect ratio as compared to structures 122 in second stage 120.

As shown in FIG. 2, the effect of the optical device on light rays arriving at the input face at a wide range of incident angles is to pass the light rays through to output face 106 so that they emerge from the output face at a reduced range of incident angles. Such is the case for the light rays whether they are arriving at a low, a medium, or a high incident angle.

Generally, gaps 114 are the same and aligned from each array to the next. For particular applications, this may not be the case because the gaps can be tailored to for the redirection of light rays desired for each stage. Additionally, the length and width of the gaps can be scaled for purposes such as ease of manufacture. Preferably, in such cases, the aspect ratio is preserved.

As may be seen from FIGS. 1 and 2, light rays arrive at an initial angle at input face 102, the initial angle being defined relative to perpendicular to input face 102. A maximum initial angle may be defined as the greatest angle relative to perpendicular that the optical device is expected to capture. The refractive indices of the host and the structures, the aspect ratios and curvature of the structures, and the lengths and widths of the gaps are then selected so that all angles of lights rays less than or equal to the maximum initial angle are passed through to emerge at output face 106.

Generally speaking, a low incident angle ray 140 will either pass straight through (if landing within the periodic gap) or undergo a minimal number of total reflections before passing through the structure. A low incident angle ray will gain some relative angle from each reflection before emerging at the output face. A medium incident angle ray 142 will undergo a mix of total reflection and complete transmission. A ray that reached the input face as a medium incident angle ray will emerge at the output face at a reduced angle. A high incident angle ray 144 will, as best seen in FIG. 3, pass through a portion 150 of structure 110 that presents as convex to the ray because the ray's angle relative to the structure is high. Then the ray will undergo total reflection when it strikes a portion 152 of the structure that presents as concave because the ray's angle relative to the structure is low. A ray that started as a high incident angle ray will emerge at the output face at a reduced angle.

Figure 6:
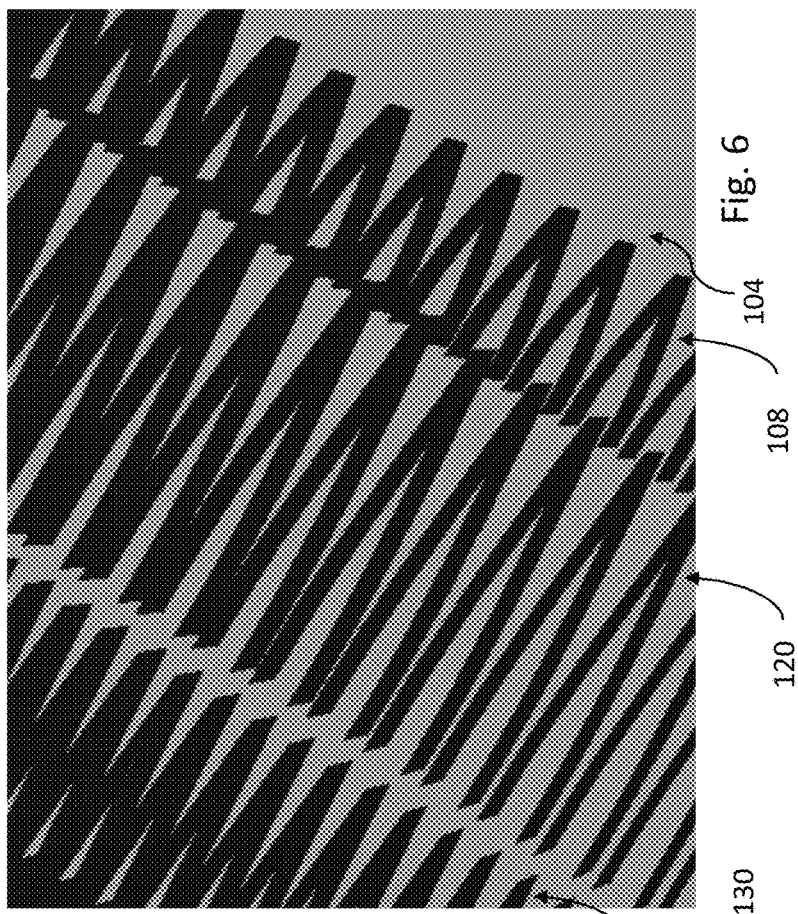
FIG. 6 is a perspective view of the three arrays of elements in the device of FIG. 2.
Figure 4:
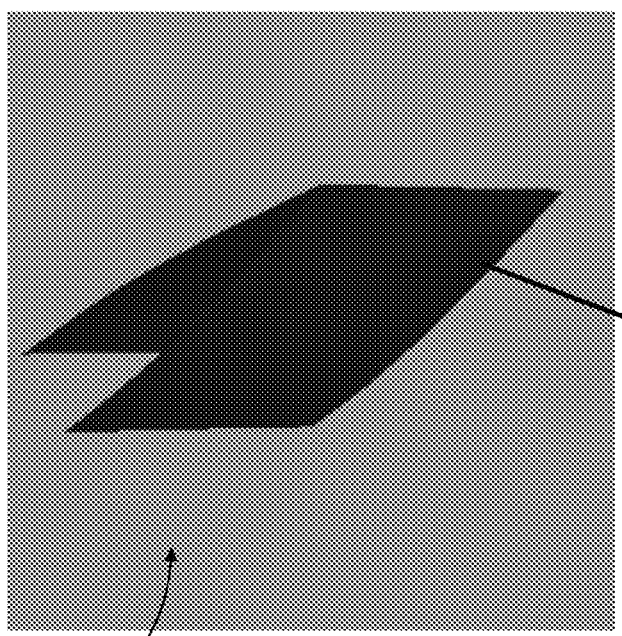
FIG. 4 is a perspective view of one of the elements in the device of FIGS. 1 and 2.
Figure 5:
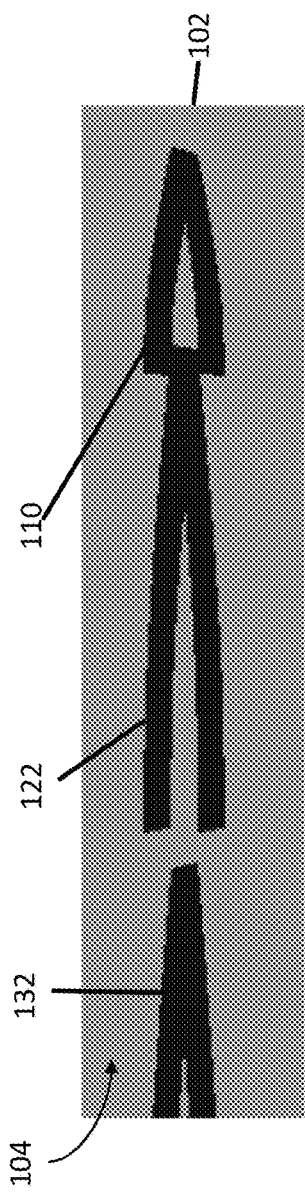
FIG. 5 is a perspective view of three elements in the device of FIG. 2, each element in a successive array.

FIGS. 4, 5, and 6 show isometric views of the embedded structures 110, 122, 132 in the host medium 104 of optical device 100, with the host medium shown in gray and the embedded structures shown as red for illustrative purposes. In practice, the host and the embedded structures are typically transparent.

Structure 110 typically has a positive curvature and need not have as positive a curvature as depicted in FIG. 3 to function. The degree of curvature may be selected for the desired concentration and collimation of light for specific ranges of input and output angles as well as for the structure to be compact and efficient.

As noted above, each stage may be designed with structures that have a higher aspect ratio than the structures of the preceding stage and the index of refraction (IOR) of the structures may be less than that of host medium 104. Typically, in progressing through the stages from the input face towards the output face, the ratio $IOR_{structure}/IOR_{host}$ approaches close to unity. For example, the initial IORs/IORh may be 1.4/1.6, and may increases towards one by increasing IORs by a variation in the composition of the thin film material. A convenient way to do so is simply mixing the low (1.4) IOR material with the high (1.6) IOR material in direct proportion to whatever intermediate IOR is desired for a particular application.

Typically, the first stage brings both the low angles and high angles to a range of medium angles. Each subsequent stage treats the medium angles as the new high angles and bring it to a lower range of angles. Arbitrary number of stages can be appended to arrive at an arbitrarily low output angle.

The host medium's index of refraction (IORh) affects the maximum angle of light rights reaching the first stage of embedded structures because the light rays passing through input face 102 are refracted by the host medium before reaching structures 110 of first stage 108. The higher the IORh the more modest the angular range impinging on the embedded structures. The relative index of refraction of the embedded structures (IORs) may be chosen just low enough to capture the highest expected incoming rays. With this design, each stage may be expected to have a lower and lower range of angles to process, facilitating each successive stage having an IORs closer to that of the host medium. Typically, IORs is chosen to be high enough relative to IORh that medium angled rays do not undergo more total reflections, thus preventing these rays from gaining more relative angle than necessary.

The maximum initial angle should be chosen just low enough to capture the highest expected incoming rays (given the structure's IORs). Since IORh, IORs, and the maximum initial angle of the structure are coupled, determining optimal values may be done by solving iteratively to minimize output angular range.

As noted above, each stage is expected to have a lower and lower range of angles to process. Hence each stage may have an initial angle of the structure more and more approaching vertical, i.e, perpendicular to the input and output faces. The initial angle may be chosen low enough that medium angled rays do not gain more angle than necessary for each total reflection it undergoes. A gradual taper of the structures may minimize the angular gain for each internal reflection, while still being able to capture high angled rays.

Figure 7:
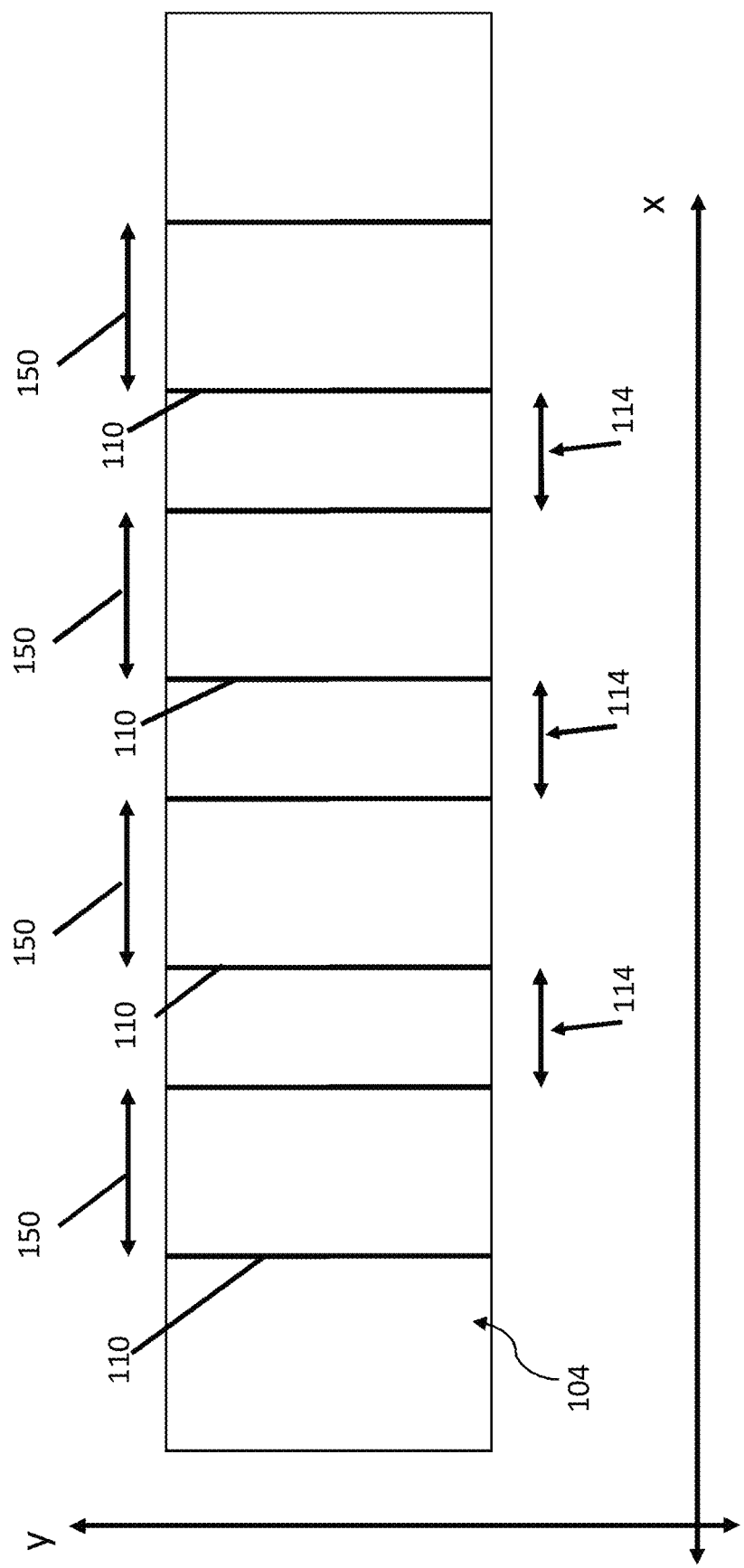
FIG. 7 is a cross-section taken at the line 7-7 of FIG. 1, showing the elements in one row of the array in the host medium.

FIG. 7 is a cross-section, taken as indicated by arrows 7-7 in FIG. 1, of an optical device according to one or more embodiments of the present disclosure illustrating the width 150 of the embedded structures and the gap between the structures. This layout may be understood as arbitrarily extensible in the x-y plane indicated in FIG. 7. Typically this is laid out as a sheet, like a pane of glass, FIG. 7 showing a view through the sheet. For the layout shown in FIG. 7, light is collimated in the x-z plane. To collimate in y-z plane also (thus making this layout completely general) a second series of structures may be added at 90 degree rotation with respect to the first series, in the x-y plane.

Gap 114 may be sized and positioned between structures to reduce the number of total reflections on the convex side of the structure and to allow light that undergoes total internal reflection to pass through the structure without getting up to the maximum critical angle before passing through. This gap can be varied to allow higher ratio of transmission, or designed to maximize interactions with the structure in accordance with particular requirements of an embodiment of the present disclosure. Preferably, the gap is not designed so large that it's possible for high angled rays to have no interactions with the embedded structure.

In one or more embodiments of the present disclosure, the embedded thin film structure's minimum thickness is greater than about 2 wavelengths of expected electromagnetic waves. So, for typical visible light (e.g. solar or lighting applications) minimum thickness is about 1 μm. With such a minimum dimension millimeter thick sheets may be provided with more than 5 stages. Preferably, the thin film thickness is selected to be thick enough such that quantum effect of tunneling will be negligible because the effect of total internal reflection may be negated if the light tunnels across the thickness of the film. An example of a structure meeting these requirements, given the 1 um minimum thickness, and assuming a 1:10 maximum ratio of film thickness to length of structure, a device may be provided with successive stages of 10 um, 20 um, 50 um, 100 um, 200 um, 500 um, for a total sheet thickness of about 880 um. Other thicknesses and lengths of the embedded structures and thickness of the sheet from input face to output face may be selected as optimized for a particular application of the device.

Figure 8:
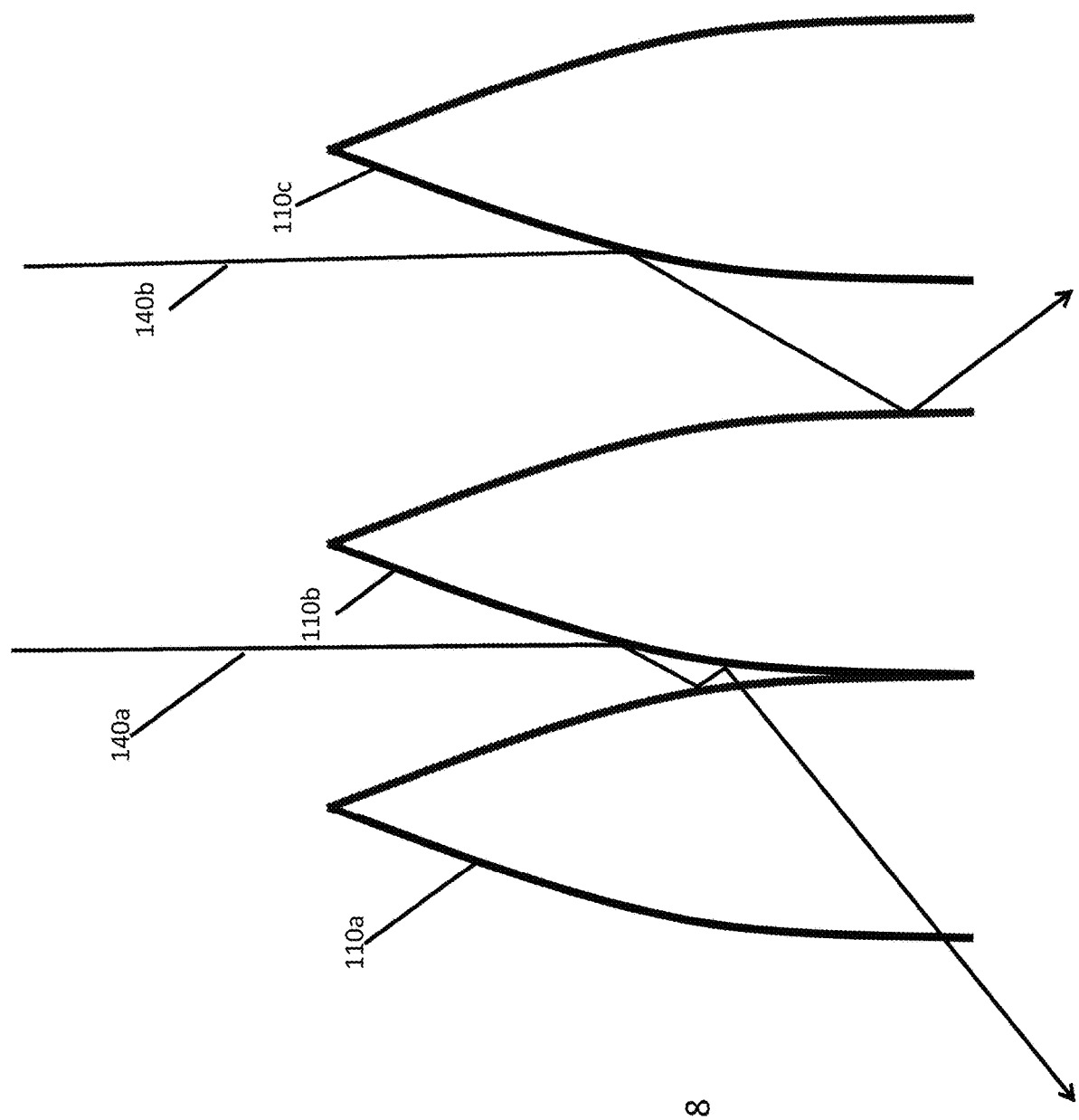
FIG. 8 is a side view of three elements in a single stage illustrating a potential difference in light ray transmission with and without a periodic gap between the elements.

An effect of the periodic gap is illustrated in FIG. 8, showing an embedded structure 110*a* placed without a gap on the left of another embedded structure 110*b*. Here, light of low incident angle 140*a* gets trapped on the convex sides of structures 110*a* and 110*b*, and with each reflection increase in relative angle until it is above the critical total internal reflection angle, likely leading to its escaping from the optical device rather than passing through. An embedded structure 110*c* placed with a gap to the right of structure 110*b* is also shown. Here, light of low incident angle 140*b* gets reflected on the convex side, and with each reflection increase in relative angle. But it can pass through the stage without achieving a relative angle higher than the critical total internal reflection angle. Thus, it may pass through with fewer reflections, thus picking up lower relative angle.

Devices embodying the characteristics of the optical device of the present disclosure may be used in a variety of applications including at least those in which a diffuse light source or sources are desired to be collimated to a narrower beam of light. These systems are useful in, but are not limited to, applications for use with natural sunlight. Examples of these in the architectural field include the use of exterior light for indoor illumination and for consistent illumination of a fixed location with a moving or otherwise variable light source, e.g., for aesthetic purposes. Also in the architectural field, the system may incorporate thermal load management with variable control over the amount of infrared energy transmitted into the building interior.

The optical device of the present disclosure may also be used in power generation applications to collimate light, e.g., for photovoltaic cells or thermal susceptors. In power generation applications, the optical device may be used in place of, or as an enhancement of, mechanical light tracking systems.

The optical device of the present disclosure may also be used in spot lighting applications, e.g., in place of a parabolic reflector.

Figures 9, 10:
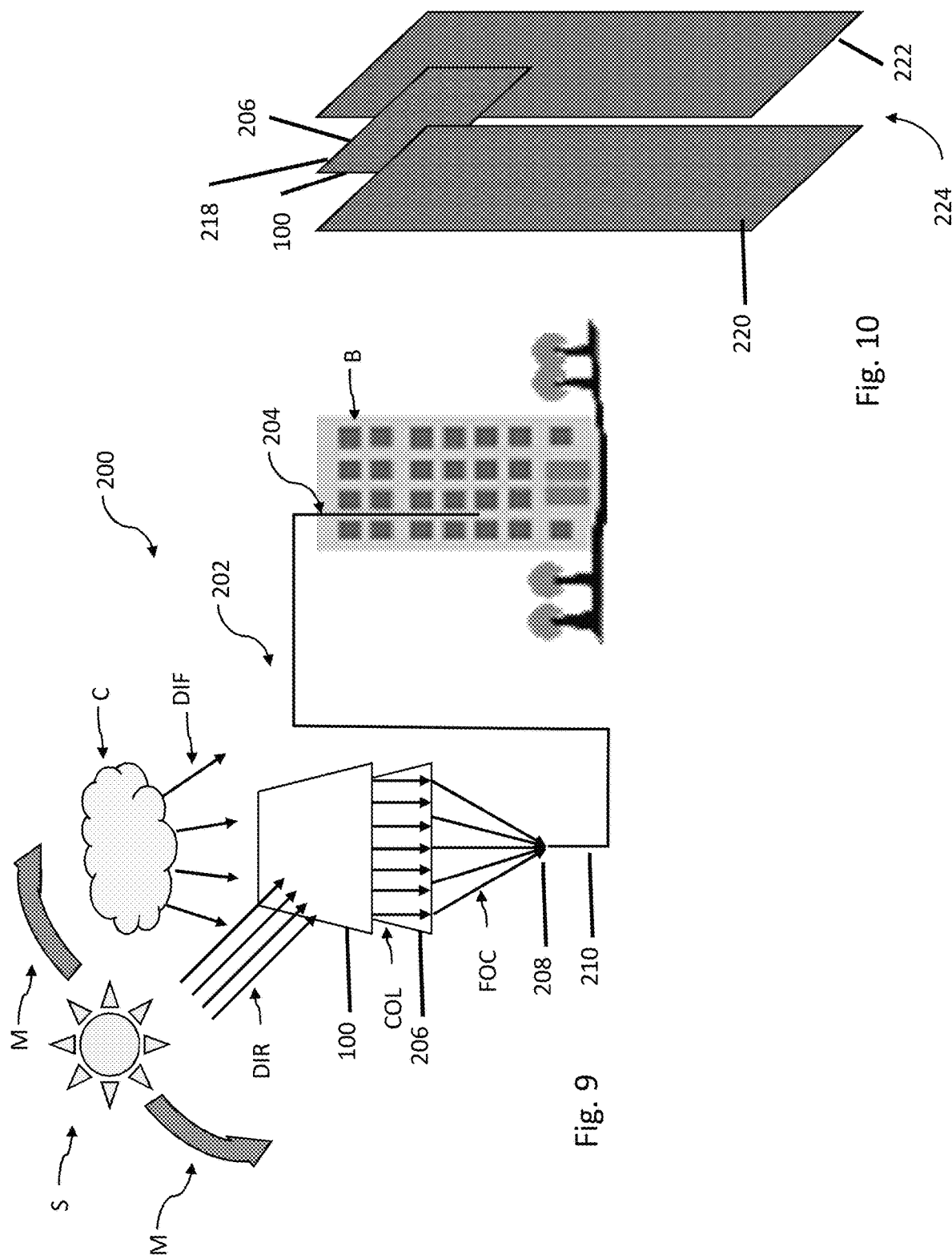
FIG. 9 is a schematic diagram of a system for illuminating an interior of a building using the optical device.
FIG. 10 is an exploded view of an assembly in accordance with the present disclosure of the optical device, Fresnel lens, and outer and inner panes of a window.

A system 200 using the optical device for illuminating an interior of a building B is shown in FIG. 9. The sun S is illustrated as having relative motion across the sky as indicated by arrows M, and producing direct rays DIR and/or diffuse rays DIF, e.g, through clouds C, that impinge on optical device 100. System 200 may include an external portion 202 and an internal portion 204. Optical device 100, a Fresnel lens 206 (or other suitable lens), and a coupler 208 for interfacing with fiber optic cables 210 may be components of external portion 202. Optical device 100 produces light rays COL collimated into a narrow range of incident angles that impinge on lens 206 which produces focused light rays FOC that impinge on fiber optic coupler 208 that sends the light rays into fiber optic cable(s) 210. Internal portion 204 of system 200 may include the portion of fiber optic cable(s) 210 that extend into building B whereby light can be piped deep into the interior of buildings for illumination at diffuser points (see 230 in FIG. 11) by suitable means for converting the light from the fiber optic cable(s) into room-illuminating light.

In system 200 or other systems for use of sunlight, the optical device may be mounted by any suitable structure on or adjacent to the building or other structure where the light will be used. This may include mounting the optical device, with or without an associated lens, such as a Fresnel lens, in a window of the building. For example, as shown in FIG. 10, a combined optical device 100 and lens 206 assembly 218 may be mounted between an outer pane 220 and inner pane 222 of a window 224. As shown in FIG. 11, fiber-optic coupler 208 may be installed adjacent collimator/lens assembly 218 and/or window 224 for transmission of light along fiber optic cables 210 to an interior room R of building B for illumination via diffuser 230. Coupler 208 may include multiple coupling points 232, located at the foci of the collimator/lens optics of assembly 218. This further illustrates how light can be piped into the building via optical cables.

Figure 12A:
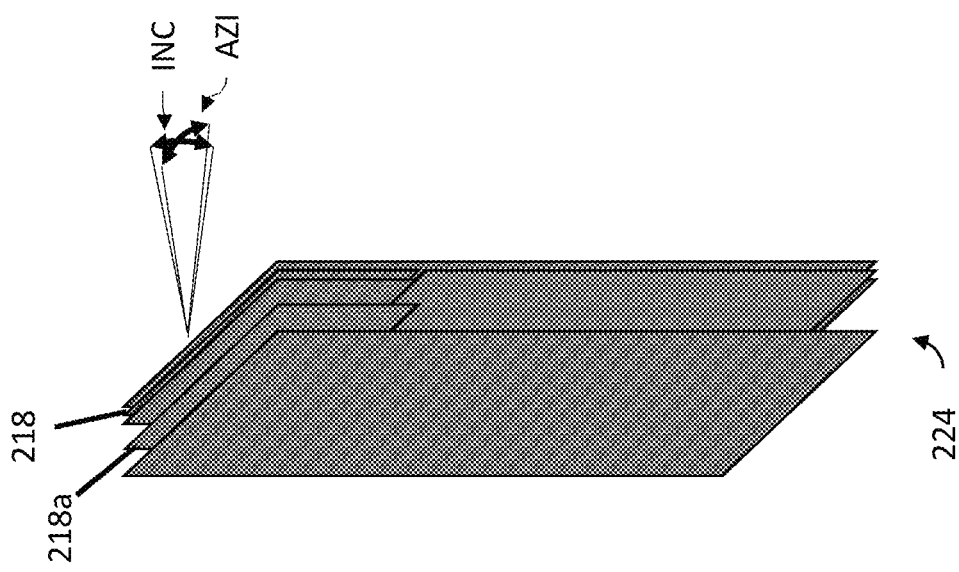
FIGS. 12a-c are pictorial views of windows incorporating the optical device and/or a polymer layer between panes of the windows.
Figure 12B:
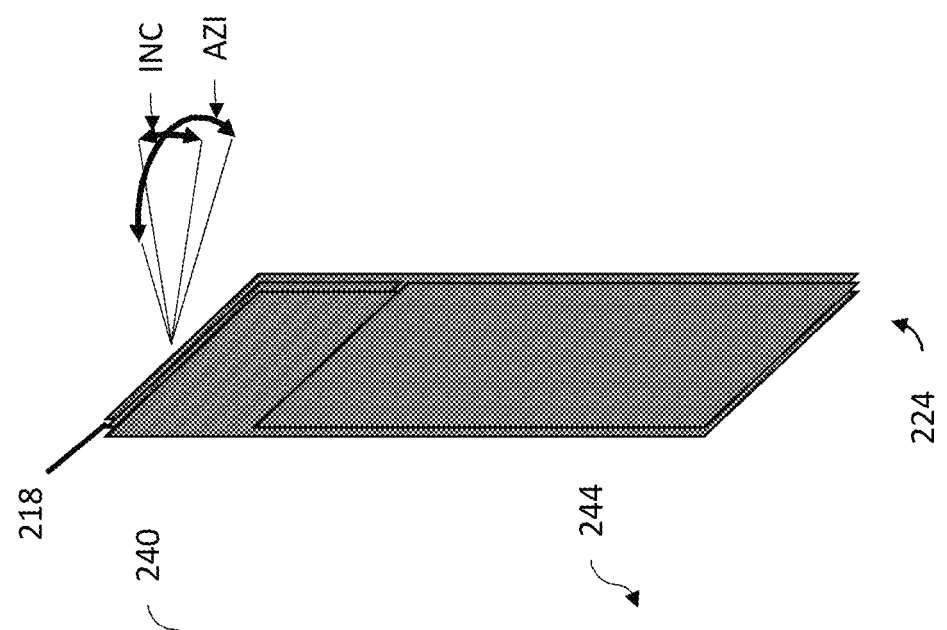
Figure 12C:
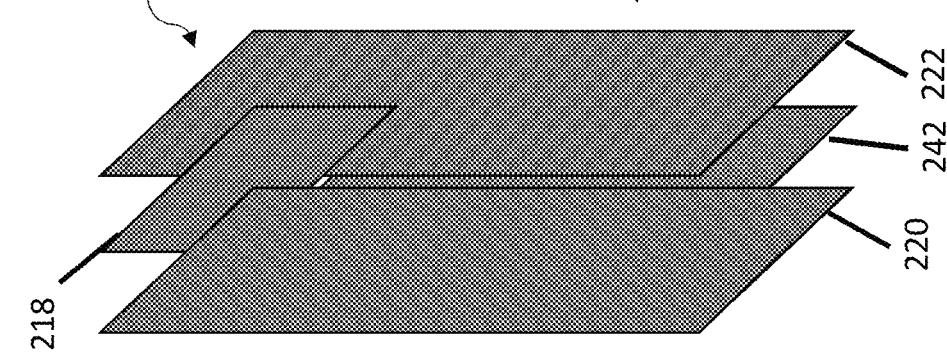

As shown in FIG. 12a, which is an exploded view of a multi-pane window 224 with three panes 216, 220, and 222, a collimator/lens assembly 218 may be installed between two of the panes in a first portion 240 of window 224 along with an encapsulated polymer layer 242 in another portion 244 of window 224. As shown in FIG. 12b, collimator/lens assembly 218 may be oriented to collimate light rays in inclination INC substantially more than in azimuth AZI. As shown in FIG. 12c, an additional collimator/lens assembly 218a may be positioned between panes 216 and 220 and oriented to colimate light rays in azimuth, producing light rays collimated in both inclination INC and azimuth AZI.

An assembly as in FIG. 12b or 12c in a window may be installed and oriented so that natural sunlight from one side of the window, despite effects of daily and seasonal relative-motion variations, and/or by cloud cover, can provide light directed at a fixed location beyond the other side of the window. Such assemblies can provide, for example, constant natural illumination, including through a stained glass window, of one or more architectural elements, e.g., ceremonially important elements. As another example, such assemblies may provide consistent natural illumination of a work of art that best accentuates the details of the work.

Figure 13:
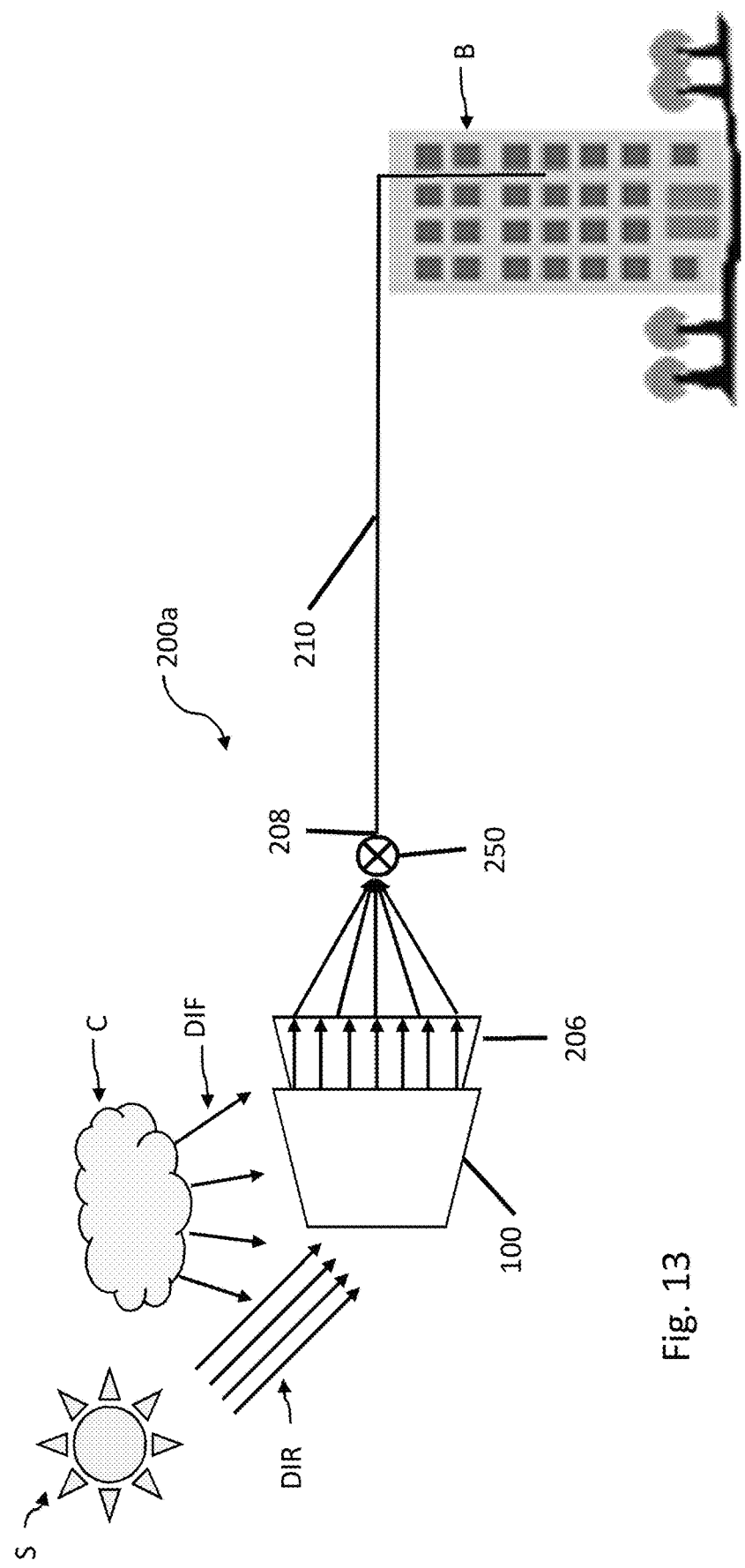
FIG. 13 is a schematic diagram of the system of FIG. 9 incorporating a variable IR filter for thermal load management.

As shown in FIG. 13, a system 200a, which may be otherwise similar to system 200, may incorporate with coupler 208 a component 250 for variably rejecting infrared light, e.g., by filtering or reflecting infrared light. n infrared is a schematic diagram of the system of FIG. 9 incorporating a variable IR filter for thermal load management. The attenuation or elimination of infrared light by component 250 may be adjusted, e.g., in coordination with the heating and cooling sensor system for building B, to allow infrared energy to pass during periods when additional heat is desired and to reject infrared energy when that is not the case.

As shown in FIG. 14, a system 260 for power generation from natural sunlight may include optical device 100, lens 206, and a photovoltaic cell 262. Such system incorporating optical device 100 may be used in place of a mechanical tracking system at considerably less cost, initially and for maintenance. Additionally, the system remains functional under conditions of diffused light, e.g., due to cloud coverage.

As shown in FIG. 15, a system 270 for power generation from natural sunlight may include optical device 100, lens 206, and a thermal susceptor 272. Typically thermal susceptor 272 is surrounded by a chamber 274 with a reflecting surface facing susceptor 272. Chamber 274 includes an aperture 276 through which light rays are focused by optical device 100 and lens 206. System 270 addresses the issue that concentrated thermal towers suffer from a physical limitation. At high enough of temperature, the black body radiation from the susceptor surface carries away as much heat as in-coming energy, severely limiting its potential Carnot efficiency. However, reflector chamber 272 will limit the black body radiation to only the size of aperture 276, thus increasing its thermal efficiency.

Figure 16:
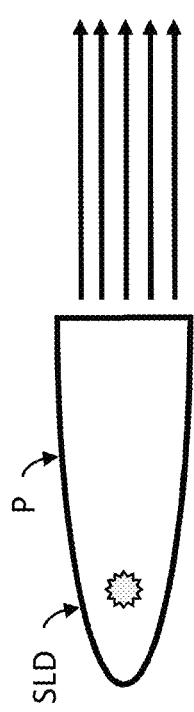
FIG. 16 is a side view of a prior art spot lighting device.
Figure 17:
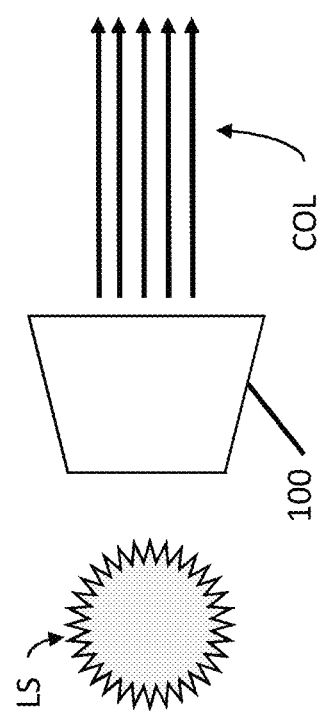
FIG. 17 is a side view of a spot lighting device incorporating an optical device in accordance with the present disclosure.

An embodiment of the present disclosure may be used in applications for spot lighting, such as headlights, projectors, stadium lights, and museum lights. FIG. 16 is a side view of a prior art spot lighting device SLD. Current spotlight technology requires precision parabolic reflector optics with very small but intense light source (such as Xenon bulbs, or halogen bulbs) precisely aligned at the focus of the parabola P. As shown in FIG. 17 a spot lighting device 280 incorporating an optical device 100 in accordance with the present disclosure may be used with a light source LS to produce collimated light COL using arbitrary light sources. For example, fluorescent lights or other lights that may be more economical than Xenon or halogen may be used, as well as relaxing geometric constraints.

As shown in FIG. 18, a manufacturing system for the optical devices of the present disclosure may include a continuous film manufacturing process 300. For example, an uncured polymer 302 may be dispensed downwardly as indicated by arrow 304 onto a micro-grooved template drum 306, with loading controlled by a doctor blade 308. A film 310 that will be embedded between polymer layers is also directed onto drum 306 by roller 312.

As best seen in FIG. 18a, which is a cross-sectional view taken from FIG. 18 as indicated at arrows 18a, the drum surface is provided with a pattern of arched shapes 314 for forming the elements 110 in array 108 for collimator 100. As film 310 passes around the drum, elements 110 are formed in it and a solvent pre-wet 316 is applied prior to joining with polymer 302.

Returning to FIG. 18, an ultraviolet light 318 may be applied as a soft cure to polymer 302 and film 310 as they pass around drum 302 and proceed as indicated by arrow 320 to a next stage of combining with another uncured polymer 322 to embed film 310 between two polymer layers. Another doctor blade 324 and UV soft cure 326 may be applied and additional stages of arrays of elements may be added at one or more subsequent stages 328. The entire assembly may proceed as indicated by arrow 330 to a suitable curing stage 332, such as a UV and/or heat hard-cure oven, producing a continuous sheet of optical device 100.

The disclosure set forth above may encompass multiple distinct inventions with independent utility. Although each of these inventions has been disclosed in its preferred form(s), the specific examples thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

I claim:

1. An optical device having an input face and an output face opposite the input face, the optical device configured for collimating incoming light rays that are arriving at the input face at a wide range of incident angles, the optical device comprising:
   a. a host medium substantially comprised of a transparent material, the host medium providing the input face and the output face;
   b. a first array of substantially transparent structures embedded within the host medium, the first array substantially parallel to the input face of the host medium, and wherein the structures of the first array each include
      i. a convex side facing the input face and having a curvature presented to the incoming light rays, and
      ii. a concave side within the structure, the concave side facing toward the output face,
      wherein the curvature of the convex side provides for at least a portion of the incoming light rays to pass through the convex side to reach the concave side within the structure, the concave side in each structure reflecting toward the output face of the host medium the light rays that reach the concave side,
   c. a second array of substantially transparent structures embedded within the host medium between the first array and the output face, and wherein the second array is substantially parallel to the first array and receives the light rays from the first array.

2. The optical device of claim 1 wherein the second array of substantially transparent structures embedded within the host medium each include a convex side facing the first array and having a curvature presented to the light rays from the first array, and a concave side within the structure, the concave side facing toward the output face.

3. The optical device of claim 2 further including a third array of substantially transparent structures embedded within the host medium, and wherein the third array is substantially parallel to the second array and located between the second array and the output face.

4. The optical device of claim 1 wherein the structures in the first array each define a first aspect ratio.

5. The optical device of claim 4 further including a second array of substantially transparent structures embedded within the host medium, and wherein the structures in the second array each define a second aspect ratio, and wherein the second aspect ratio is greater than the first aspect ratio.

6. The optical device of claim 5 further including a third array of substantially transparent structures embedded within the host medium, and wherein the structures in the third array each define a third aspect ratio, and wherein the third aspect ratio is greater than the second aspect ratio.

7. The optical device of claim 1 wherein the host medium has a host index of refraction and the structures of the first array have a first array index of refraction, and wherein the host index of refraction is greater than the first array index of refraction.

8. The optical device of claim 7 further including a second array of substantially transparent structures embedded within the host medium, and having a second array index of refraction, and wherein the second array index of refraction is greater than the first array index of refraction.

9. The optical device of claim 8 further including a third array of substantially transparent structures embedded within the host medium, and having a third array index of refraction, and wherein the third array index of refraction is greater than the second array index of refraction.

10. A system for using an exterior light for illuminating an interior space in a building, the system comprising an external portion and an internal portion, the external portion including an optical device and a coupler for interfacing with a fiber optic cable, and the internal portion including a diffuser coupled to the fiber optic cable, wherein the optical device includes an input face and an output face opposite the input face, and a. a host medium substantially comprised of a transparent material, the host medium providing the input face and the output face; and b. a first array of substantially transparent structures embedded within the host medium, the first array substantially parallel to the input face of the host medium, and wherein the structures of the first array each include i. a convex side facing the input face and having a curvature presented to the incoming light rays, and ii. a concave side within the structure, the concave side facing toward the output face, wherein the curvature of the convex side provides for at least a portion of the incoming light rays to pass through the convex side to reach the concave side within the structure, the concave side in each structure reflecting toward the output face of the host medium the light rays that reach the concave side, c. a second array of substantially transparent structures embedded within the host medium between the first array and the output face, and wherein the second array is substantially parallel to the first array and receives the light rays from the first array.

11. The system of claim 10 further including a Fresnel lens interposed between the optical device and the coupler for interfacing with the fiber optic cable.

12. The system of claim 10 further including a filter for attenuating infrared energy coupled to the coupler for interfacing with the fiber optic cable.

13. The system of claim 12 wherein the filter is variable.

14. The system of claim 10 wherein the optical device is incorporated into a window of the building.

15. The system of claim 14 wherein the window includes at least two panes and the optical device is incorporated between the two panes.

16. The system of claim 10 wherein the optical device collimates light in both inclination and azimuth.

17. The system of claim 10 wherein the coupler includes more than one coupling point, each located at a focus of the optical device.

18. A system for generating power from a light source, the system comprising:

a collimating lens, a focusing lens, and a power generation component, wherein the collimating lens includes a. a host medium substantially comprised of a transparent material, the host medium providing an input face and an output face opposite the input face; and b. a first array of substantially transparent structures embedded within the host medium, the first array substantially parallel to the input face of the host medium, and wherein the structures of the first array each include i. a convex side facing the input face and having a curvature presented to the incoming light rays, and ii. a concave side within the structure, the concave side facing toward the output face, wherein the curvature of the convex side provides for at least a portion of the incoming light rays to pass through the convex side to reach the concave side within the structure, the concave side in each structure reflecting toward the output face of the host medium the light rays that reach the concave side, c. a second array of substantially transparent structures embedded within the host medium between the first array and the output face, and wherein the second array is substantially parallel to the first array and receives the light rays from the first array.

19. The system of claim 18 wherein the power generating component is a photovoltaic cell.

20. The system of claim 18 wherein the power generating component is a thermal susceptor.

* * * * *